(12) United States Patent
Bruce et al.

(10) Patent No.: US 10,121,676 B2
(45) Date of Patent: Nov. 6, 2018

(54) INTERCONNECTS FABRICATED BY HYDROFLUOROCARBON GAS-ASSISTED PLASMA ETCH

(71) Applicants: International Business Machines Corporation, Armonk, NY (US); Zeon Corporation, Tokyo (JP)

(72) Inventors: Robert L. Bruce, White Plains, NY (US); Eric A. Joseph, White Plains, NY (US); Joe Lee, Albany, NY (US); Takefumi Suzuki, Harrison, NY (US)

(73) Assignees: International Business Machines Corporation, Armonk, NY (US); Zeon Corporation, Tokyo (JP)

(*) Notice: Subject to any disclaimer, the term of this patent is extended or adjusted under 35 U.S.C. 154(b) by 0 days.

(21) Appl. No.: 15/847,369

(22) Filed: Dec. 19, 2017

(65) Prior Publication Data

US 2018/0122649 A1    May 3, 2018

Related U.S. Application Data

(62) Division of application No. 14/849,077, filed on Sep. 9, 2015, now Pat. No. 9,934,984.

(51) Int. Cl.
| | |
|---|---|
| H01L 29/06 | (2006.01) |
| H01L 29/40 | (2006.01) |
| H01L 21/311 | (2006.01) |
| H01L 23/532 | (2006.01) |
| H01L 23/528 | (2006.01) |
| H01L 21/768 | (2006.01) |

(52) U.S. Cl.
CPC .. *H01L 21/31116* (2013.01); *H01L 21/76802* (2013.01); *H01L 21/76877* (2013.01); *H01L 23/528* (2013.01); *H01L 23/5329* (2013.01)

(58) Field of Classification Search
CPC ............. H01L 2924/381; H01L 23/31; H01L 23/5226; H01L 23/5283; H01L 23/53204; H01L 23/528; H01L 27/14636
USPC ............... 257/618, 621, 686, 750, 774, 775
See application file for complete search history.

(56) References Cited

U.S. PATENT DOCUMENTS

| | | | |
|---|---|---|---|
| 6,410,426 B1 | 6/2002 | Xing et al. | |
| 6,790,784 B2 | 9/2004 | Catabay et al. | |

(Continued)

FOREIGN PATENT DOCUMENTS

| | | |
|---|---|---|
| JP | 4046436 B2 | 2/2008 |
| TW | 201005793 A | 7/2008 |

OTHER PUBLICATIONS

International Search Report and Written Opinion of corresponding application PCT/US2016/023935, dated Aug. 12, 2016, 12 pages.

*Primary Examiner* — Hsien Ming Lee
(74) *Attorney, Agent, or Firm* — Kristofer Haggerty

(57) ABSTRACT

In one embodiment, a method for hydrofluorocarbon gas-assisted plasma etch for interconnect fabrication includes providing a layer of a dielectric material and etching a trench in the layer of the dielectric material, by applying a mixture of an aggressive dielectric etch gas and a polymerizing etch gas to the layer of the dielectric material. In another embodiment, an integrated circuit includes a plurality of semiconductor devices and a plurality of conductive lines connecting the plurality of semiconductor devices. A pitch of the plurality of conductive lines is approximately twenty-eight nanometers.

19 Claims, 5 Drawing Sheets

(56) References Cited

U.S. PATENT DOCUMENTS

| | | |
|---|---|---|
| 7,091,081 B2 | 8/2006 | Deshpande et al. |
| 8,088,691 B2 | 1/2012 | Kiehlbauch et al. |
| 8,546,264 B2 | 10/2013 | Olynick et al. |
| 8,614,151 B2 | 12/2013 | Benson et al. |
| 8,691,698 B2 | 4/2014 | Xu et al. |
| 8,916,054 B2 | 12/2014 | Brink et al. |
| 8,986,493 B2 | 3/2015 | Tahara et al. |
| 2001/0012694 A1 | 8/2001 | Coburn et al. |
| 2005/0023694 A1 | 2/2005 | Bjorkman et al. |
| 2005/0247670 A1 | 11/2005 | Yamada et al. |
| 2006/0019491 A1 | 1/2006 | Soda |
| 2006/0024956 A1 | 2/2006 | Zhijian et al. |
| 2006/0032833 A1 | 2/2006 | Kawaguchi et al. |
| 2007/0077774 A1 | 4/2007 | Yoshida |
| 2009/0032963 A1* | 2/2009 | Tran ............... H01L 21/02164 257/774 |
| 2009/0042398 A1 | 2/2009 | Feurprier |
| 2010/0096645 A1 | 4/2010 | Sonoda et al. |
| 2010/0297849 A1 | 11/2010 | Miyake et al. |
| 2013/0122707 A1 | 5/2013 | Shimizu et al. |
| 2013/0344698 A1 | 12/2013 | Ochiai et al. |
| 2014/0120733 A1 | 5/2014 | Cheung et al. |
| 2015/0056814 A1 | 2/2015 | Ling et al. |
| 2015/0064918 A1 | 3/2015 | Ranjan et al. |
| 2015/0069581 A1 | 3/2015 | Chang et al. |
| 2016/0064274 A1* | 3/2016 | Peng ............... H01L 21/76813 257/774 |

\* cited by examiner

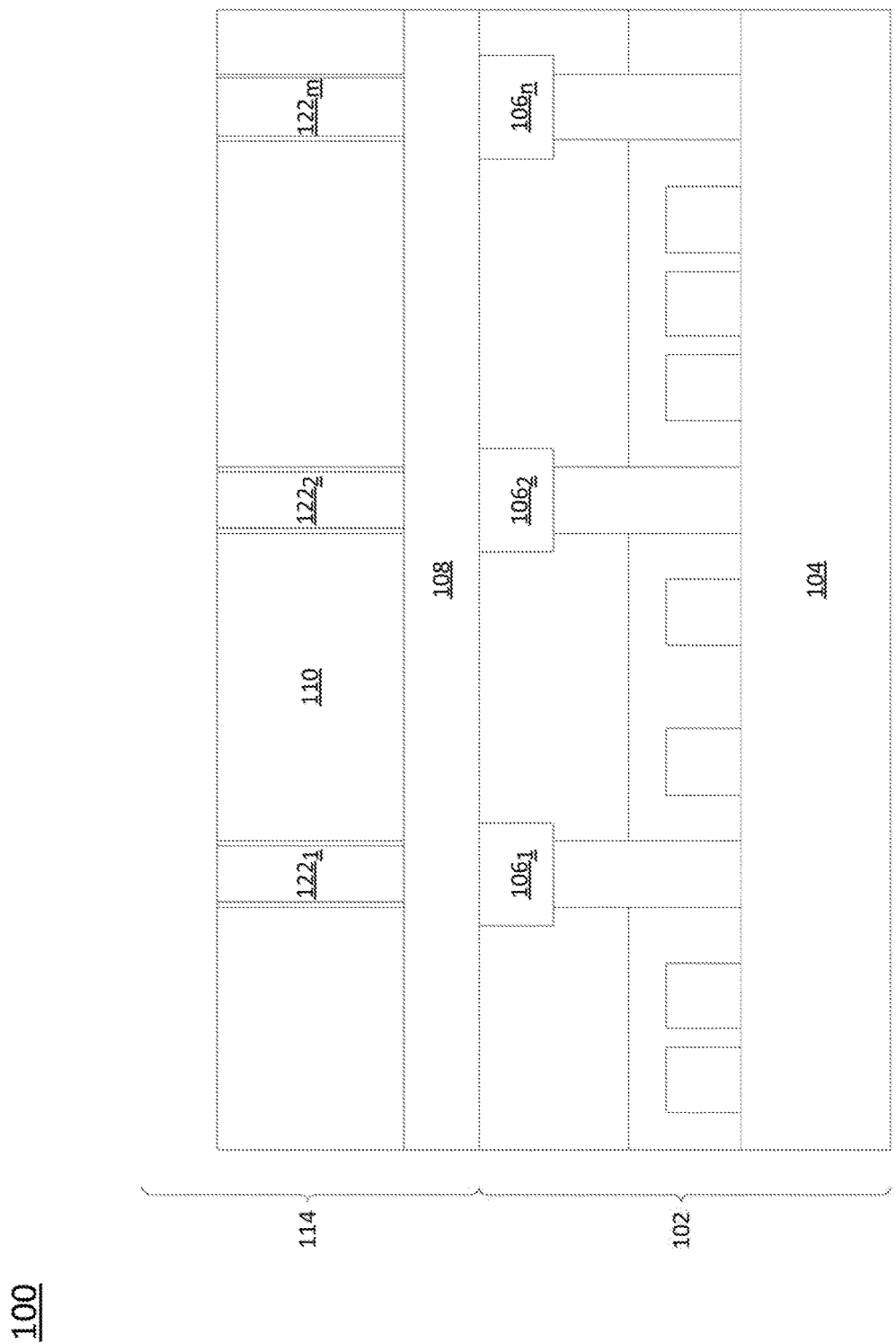

INTERCONNECTS FABRICATED BY HYDROFLUOROCARBON GAS-ASSISTED PLASMA ETCH

BACKGROUND OF THE INVENTION

The present invention relates generally to integrated circuits and relates more specifically to metal patterning processes for use in manufacturing integrated circuits.

Integrated circuits commonly use metal interconnects (or "lines") to connect transistors and other semiconductor devices on the ICs. These interconnects are typically fabricated during back end of line (BEOL) processes, after the individual semiconductor devices have been formed on the wafer.

These interconnects are typically fabricated using an additive damascene process in which an underlying insulating layer (e.g., silicon oxide) is patterned with open trenches. A subsequent deposition of a conductive metal on the insulating layer fills the trenches with metal. The metal is removed to the top of the insulating layer, but remains within the trenches to form a patterned conductor. Successive layers of insulator and metal are formed according to this damascene process, resulting in a multilayer metal interconnect structure.

SUMMARY OF THE INVENTION

In one embodiment, a method for hydrofluorocarbon gas-assisted plasma etch for interconnect fabrication includes providing a layer of a dielectric material and etching a trench in the layer of the dielectric material, by applying a mixture of an aggressive dielectric etch gas and a polymerizing etch gas to the layer of the dielectric material.

In another embodiment, a method for hydrofluorocarbon gas-assisted plasma etch for interconnect fabrication includes providing a capping layer, providing a layer of a dielectric material directly over the capping layer, and providing a mask layer directly over the layer of the dielectric material. The mask layer is patterned to expose portions of the layer of the dielectric material, and the portions of the layer of the dielectric material are then etched to form a plurality of trenches. The etching is performed using a mixture of an aggressive dielectric etch gas and a polymerizing etch gas, and wherein the etching stops at the capping layer. The plurality of trenches is filled with a conductive metal to form a plurality of conductive lines.

In another embodiment, an integrated circuit includes a plurality of semiconductor devices and a plurality of conductive lines connecting the plurality of semiconductor devices. A pitch of the plurality of conductive lines is approximately twenty-eight nanometers.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1E are cross sections illustrating various stages of fabrication of an integrated circuit, according to embodiments of the present disclosure.

DETAILED DESCRIPTION

In one embodiment, a method and apparatus for hydrofluorocarbon gas-assisted plasma etch for interconnect fabrication is disclosed. Metal interconnects are typically formed during the back end of line (BEOL) stage of integrated circuit fabrication. For instance, a dry etch process using a fluorocarbon gas can be employed to define trenches in a dielectric layer of the integrated circuit. A conductive metal is then deposited in the trenches to form the interconnects. Using a fluorocarbon gas with low polymerization (such as carbon tetrafluoride ($CF_4$), sulfur hexafluoride ($SF_6$), or nitrogen trifluoride ($NF_3$)), one can define trenches that will provide good line-to-via connections; however such gases are not selective to the hard mask layer and tend not to maintain the pattern dimensions of the interconnects. Using a fluorocarbon gas with high polymerization (such as perfluorocyclobutane ($C_4F_8$), hexafluorobutadiene ($C_4F_6$), octafluorocyclopentene ($C_5F_8$), fluoromethane ($Ch_3F$), fluoroform ($CHF_3$), or heptafluorocyclopentene ($C_5HF_7$)), one can achieve better selectivity and maintain the pattern dimensions; however, these gases are prone to aspect ratio-dependent etching and etch stop that result in poor line-to-via connections. Additional gases can be added to promote dissociation, mixing, and improve the resultant line profiles, such as argon (Ar), nitrogen ($N_2$), carbon monoxide (CO), oxygen ($O_2$), carbon dioxide ($CO_2$), or the like.

Embodiments of the invention etch a pattern of trenches into a dielectric layer of an integrated circuit using a mixture of an aggressive dielectric etch gas and a polymerizing etch gas. Within the context of the disclosure, an aggressive dielectric etch gas is understood to be a fast-acting, non-selective chemical etching agent that leaves minimal deposits. The polymerizing etch gas passivates the vertical sidewalls of the trenches and protects them from damage and lateral etching by the aggressive dielectric etch gas. The resultant trenches maintain target pattern dimensions and sidewall profiles, allowing small, dense patterns to be formed. Moreover, the etch can be performed quickly and with minimal to no reactive ion etch lag.

FIGS. 1A-1E are cross sections illustrating various stages of fabrication of an integrated circuit 100, according to embodiments of the present disclosure. As such, FIGS. 1A-1E also collectively serve as a flow diagram illustrating portions of one embodiment of a method for fabricating the integrated circuit 100, according to the present invention.

Figure 1A:
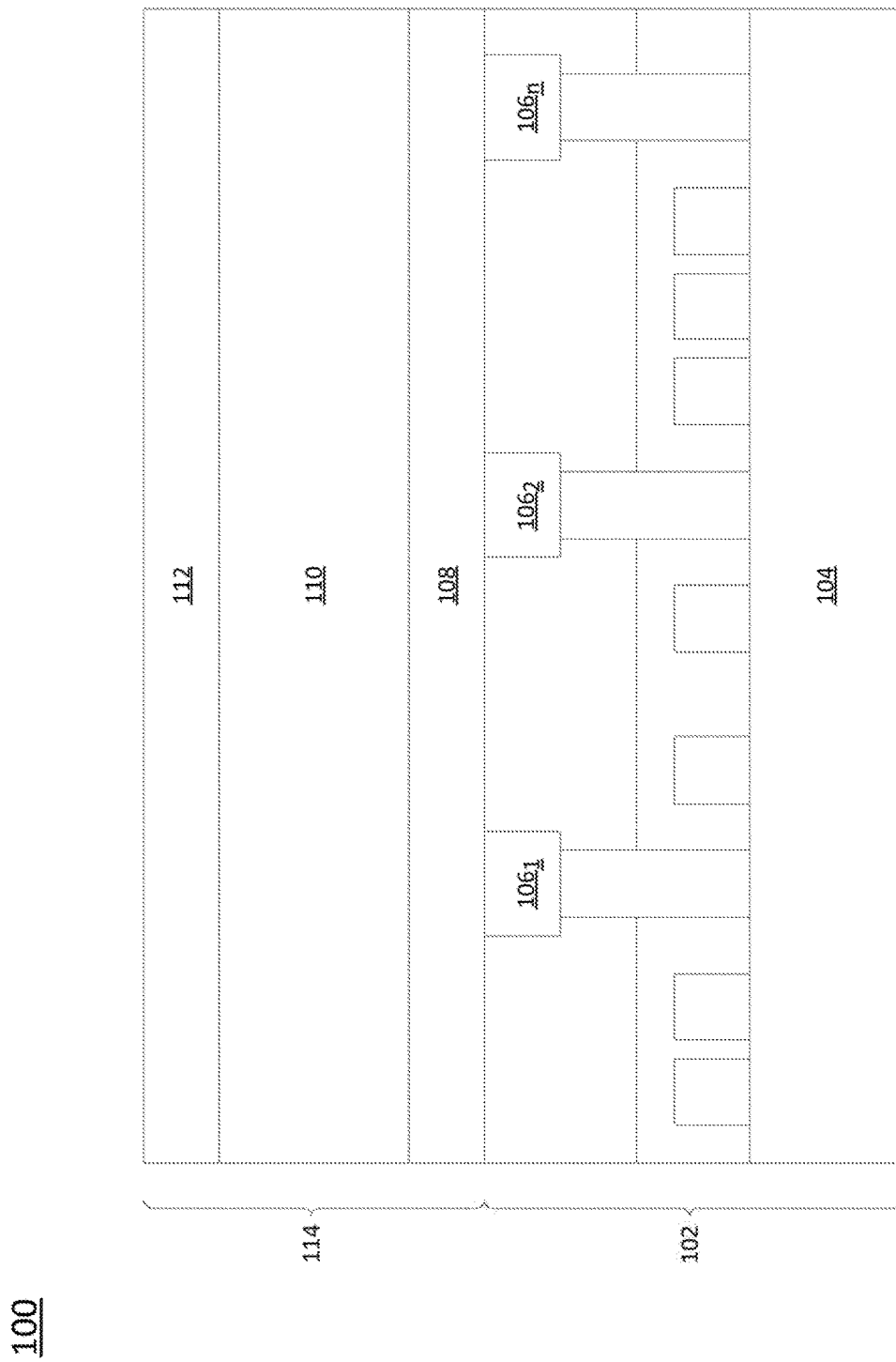

In particular, FIG. 1A illustrates the integrated circuit 100 at an intermediate stage in the processing, i.e., after front end of line processing is complete, but prior to the completion of back end of line processing. In other words, the integrated circuit 100 does not start out in the form illustrated in FIG. 1A, but may develop into the illustrated structure over several processing steps which are not illustrated but are well-known to those of skill in the art.

The integrated circuit 100 generally comprises a front end 102, which may include a semiconductor wafer 104 (formed, for example, from crystalline silicon (Si), germanium (Ge), silicon germanium (SiGe), gallium arsenide (GaAs), or other semiconductor materials) and a pattern of individual, unconnected structures formed on the semiconductor wafer 104, such as a pattern of gates $106_1$-$106_n$ (hereinafter collectively referred to as "gates 106"). The gates 106 may comprise a number of transistors and/or other semiconductor devices. For the purposes of clarity, the front end 102 of the integrated circuit 100 is illustrated in a simplified form.

One embodiment of the present disclosure deposits a capping layer 108 on the front end 102. In one embodiment, the capping layer 108 may be formed, for example, from silicon nitride (SiN), silicon carbonitride (SiCN), or silicon oxycarbonitride ($SiC_xN_yO_z$). The capping layer 108 may be deposited, for example, via plasma-enhanced chemical vapor deposition (PECVD). A dielectric layer 110 is deposited directly on the capping layer 108 and may be formed from a porous dielectric material such as a low-k dielectric, an ultra-low-k dielectric (ULK), silicon dioxide ($SiO_2$), or other dielectric materials. The dielectric layer 110 may also be deposited via PECVD. A mask layer 112 is then deposited directly on the dielectric layer 110. The mask layer 112 may be formed from a metal, from silicon nitride (SiN), from photoresist, or from other materials. In one example, the mask layer 112 comprises a multilayer mask, such as a trilayer resist (which may comprise, for example, layers of resist, silicon-containing anti-reflective coating (SiARC), and carbon hard mask). The mask layer 112, if composed of photoresist, may be deposited via spin coating. Collectively, the capping layer 108, dielectric layer 110, and mask layer 112 form the beginnings of the back end 114 of the integrated circuit 100.

Figure 1B:
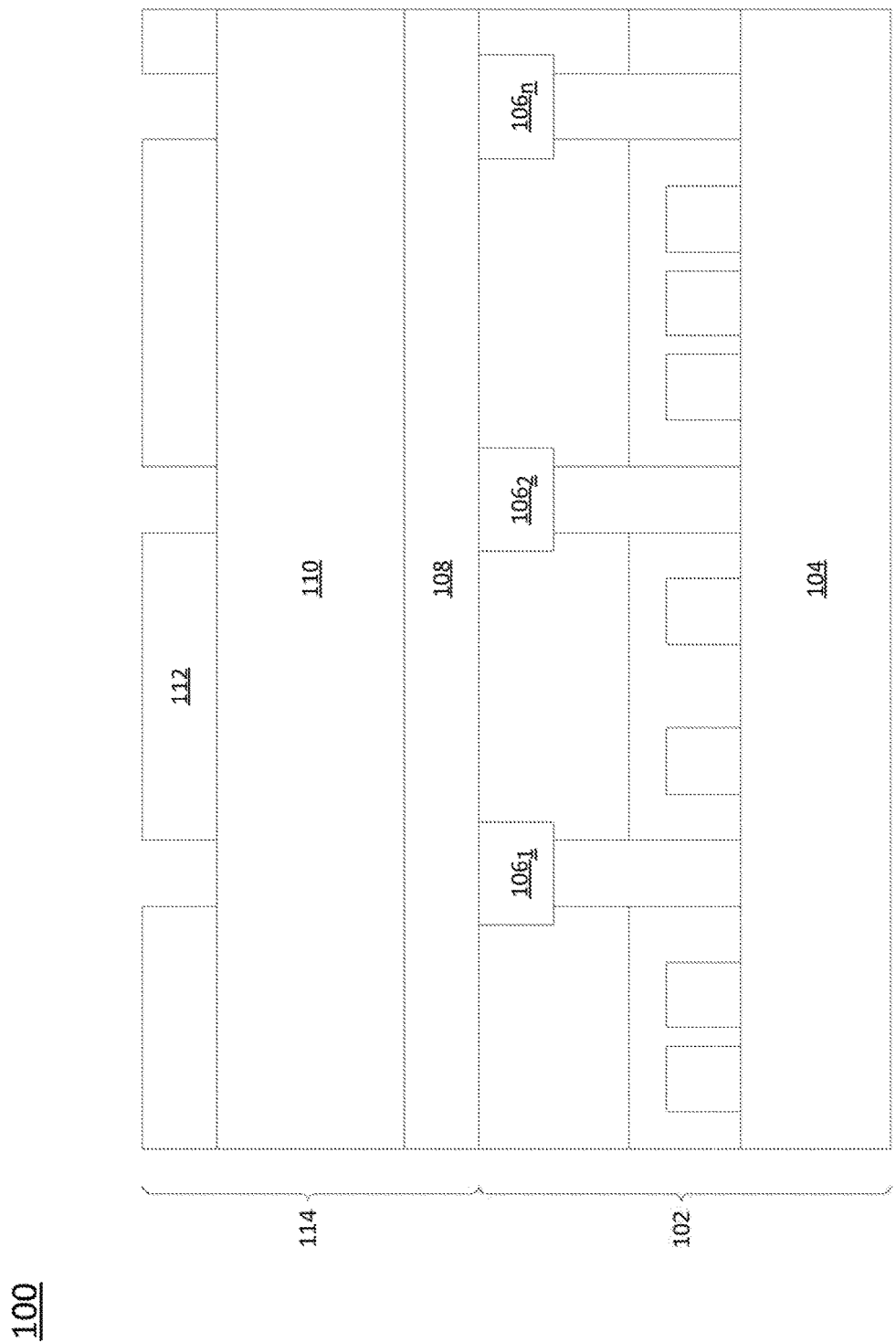

As illustrated in FIG. 1B, the mask layer 112 is patterned to expose portions of the dielectric layer 110. In one embodiment the mask layer 112 is patterned using a photolithography technique, such as optical lithography or direct write electron beam lithography. In one embodiment, the photolithography technique includes a positive resist that allows removal of the mask layer 112 down to the dielectric layer 110, except for the portions of the mask layer 112 illustrated in FIG. 1B.

Figure 1C:
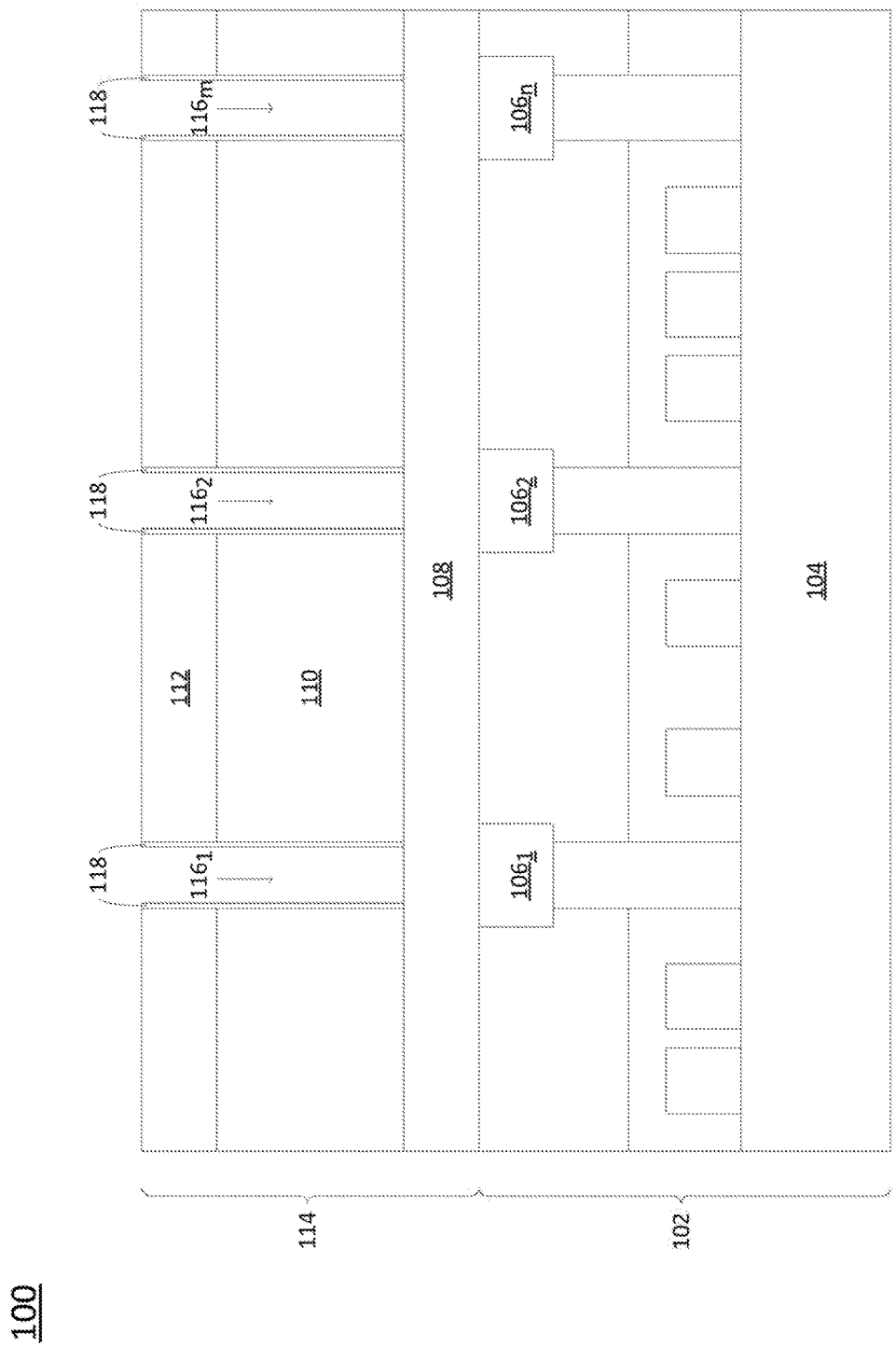

As illustrated in FIG. 1C, the dielectric layer 110 is next etched, using a mixture of an aggressive dielectric etch gas and a polymerizing etch gas. Thus, the aggressive dielectric etch gas and the polymerizing etch gas are applied simultaneously in the mixture. The aggressive dielectric etch gas may comprise, for example, a fluorocarbon gas such as carbon tetrafluoride ($CF_4$), sulfur hexafluoride ($SF_6$), or nitrogen trifluoride ($NF_3$). The polymerizing etch gas may comprise, for example, a hydrofluorocarbon gas compound such as heptafluorocyclopentane ($C_5HF_7$). In other examples, the polymerizing etch gas may comprise perfluorocyclobutane ($C_4F_8$), hexafluorobutadiene ($C_4F_6$), octafluorocyclopentene ($C_5F_8$), or fluormethane ($Ch_3F$), fluoroform ($CHF_3$). In one embodiment, the mixture of gases comprises approximately twenty to forty parts aggressive dielectric etch gas to one part polymerizing etch gas. The ratio can be adjusted as needed based on design requirements. For example, a greater concentration of aggressive dielectric etch gas may be useful when wider interconnects are desired. Most ratios will produce desirable results within a range of −10° Celsius to 60° Celsius.

The aggressive etch gas removes the portions of the dielectric layer 110 that do not reside directly beneath the remaining portion of the mask layer 112, down to the capping layer 108, which functions as a selective etch stop. The etch results in the formation of one or more trenches $116_1$-$116_m$ (hereinafter collectively referred to as "trenches 116") in the dielectric layer 110. As the aggressive etch gas is removing the dielectric material, the polymerizing etch gas deposits a carbon-rich layer on the exposed vertical sidewalls of the trenches 116 (as illustrated by passivation layers 118). Thus, the passivation layers 118 protect portions of the porous dielectric layer 110 from damage due to prolonged exposure to the aggressive etch gas.

Figure 1D:
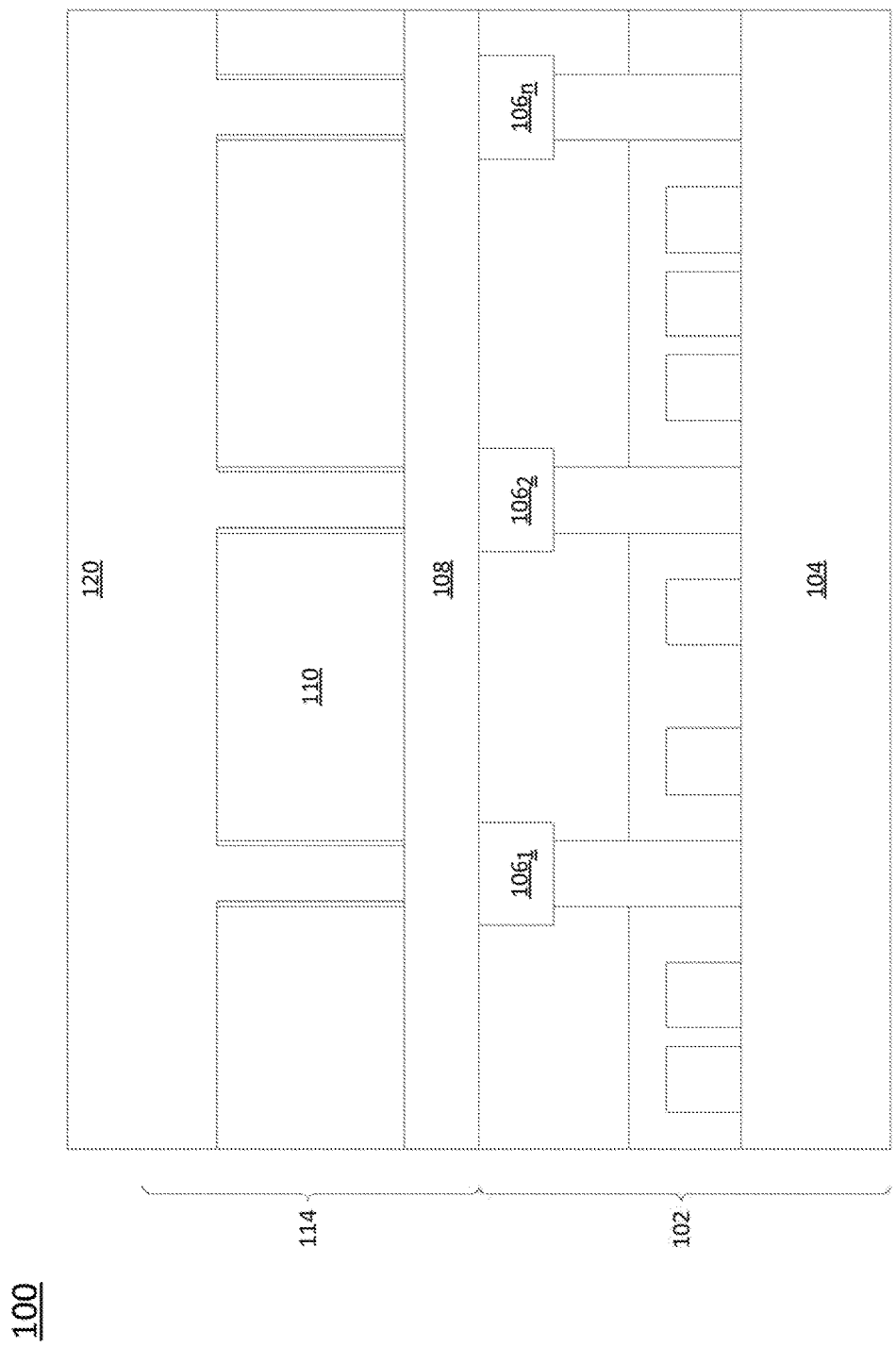

As illustrated in FIG. 1D, the mask layer 112 is next stripped (e.g., via a plasma etch) and wet cleaned. This also results in the passivation layers 118 being removed. A conductive metal layer 120 is then deposited directly on the dielectric layer 110. The conductive metal layer 120 fills the trenches 116 in the dielectric layer 110, thereby forming a pattern of fine lines or interconnects in the back end 114 of the integrated circuit 100. The conductive metal layer 120 may comprise, for example, copper (Cu), a copper alloy, gold (Au), nickel (Ni), cobalt (Co), silver (Ag), ruthenium (Ru), or any other material that does not readily form a volatile species. Deposition of the conductive metal layer 120 may be performed via electroplating and/or other deposition techniques, and may or may not be preceded by deposition of a barrier layer over the dielectric layer 110.

As illustrated in FIG. 1E, the conductive metal layer 120 is next planarized (e.g., via chemical mechanical planarization or other techniques) down to the dielectric layer 110. The remaining portions of the conductive metal layer (e.g., the portions filling the trenches) form a pattern of thin conductive lines or interconnects $122_1$-$122_m$ (hereinafter collectively referred to as "interconnects 122").

Additional fabrication steps may follow to form additional layers of the integrated circuit 100. For instance, additional layers of interconnects may be formed using the techniques described above and/or other techniques. Additionally, the process described above to fabricate the interconnects could be used to fabricate other components of the integrated circuit 100, including vias and contacts. Thus, application of the disclosed techniques is not limited to the fabrication of interconnects.

Thanks to the passivation of the vertical trench sidewalls by the polymerizing etch gas, the interconnects that are formed as a result of the illustrated process have even, uniform profiles with precise dimensions (e.g., trench and via width). This allows small, dense patterns of high-yielding interconnects to be fabricated. For instance, pattern densities with pitches as small as approximately twenty-eight nanometers may be obtained. Moreover, the mixture of the polymerizing etch gas and aggressive dielectric etch gas reduces the occurrence of pattern-dependent etch rates. The vertical etch rate of the trenches is actually quite fast since the aggressive dielectric etch gas forms the majority of the etch gas mixture; however, the hydrogen in the polymerizing etch gas removes some of the fluorine in the aggressive dielectric etch gas and allows a more carbon-rich layer to deposit on the trench sidewalls.

While the foregoing is directed to embodiments of the present invention, other and further embodiments of the invention may be devised (such as embodiments pertaining to contact and via-level etching) without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:
1. An integrated circuit, comprising:
 a plurality of semiconductor devices; and
 a plurality of conductive lines connecting the plurality of semiconductor devices, wherein a pitch of the plurality of conductive lines is approximately twenty-eight nanometers, wherein each of the plurality of conductive lines comprises:
a line of a conductive metal; and
a carbon-containing layer positioned directly between the conductive metal and a dielectric material.

2. The integrated circuit of claim 1, wherein the plurality of conductive lines comprises copper.

3. The integrated circuit of claim 1, wherein the plurality of conductive lines comprises a copper alloy.

4. The integrated circuit of claim 1, wherein the plurality of conductive lines comprises gold.

5. The integrated circuit of claim 1, wherein the plurality of conductive lines comprises nickel.

6. The integrated circuit of claim 1, wherein the plurality of conductive lines comprises cobalt.

7. The integrated circuit of claim 1, wherein the plurality of conductive lines comprises silver.

8. The integrated circuit of claim 1, wherein the plurality of conductive lines comprises ruthenium.

9. An integrated circuit, comprising:
a front end, comprising:
a semiconductor wafer; and
a plurality of semiconductor devices formed on the semiconductor wafer; and
a back end, comprising:
a dielectric layer;
a plurality of conductive lines formed in the dielectric layer, wherein a pattern density of the plurality of conductive lines has a pitch of approximately twenty-eight nanometers; and
a carbon-containing layer positioned directly between the dielectric layer and each conductive line of the plurality of conductive lines.

10. The integrated circuit of claim 9, wherein the plurality of conductive lines has a uniform profile.

11. The integrated circuit of claim 9, wherein the back end further comprises:
a capping layer positioned directly between the dielectric layer and the front end.

12. The integrated circuit of claim 11, wherein the capping layer comprises silicon nitride.

13. The integrated circuit of claim 11, wherein the capping layer comprises silicon carbonitride.

14. The integrated circuit of claim 11, wherein the capping layer comprises silicon oxycarbonitride.

15. The integrated circuit of claim 11, wherein the dielectric layer comprises a low-k dielectric.

16. The integrated circuit of claim 11, wherein the dielectric layer comprises an ultra-low-k dielectric.

17. The integrated circuit of claim 11, wherein the dielectric layer comprises silicon dioxide.

18. An integrated circuit, comprising:
a front end, comprising:
a semiconductor wafer; and
a plurality of semiconductor devices formed on the semiconductor wafer; and
a back end, comprising:
a dielectric layer;
a plurality of conductive lines formed in the dielectric layer, wherein the plurality of conductive lines has a uniform profile and a pattern density of the plurality of conductive lines has a pitch of approximately twenty-eight nanometers;
a carbon-containing layer positioned directly between the dielectric layer and each conductive line of the plurality of conductive lines; and
a capping layer positioned directly between the dielectric layer and the front end.

19. The integrated circuit of claim 18, wherein the plurality of conductive lines comprises a plurality of interconnects for electrically connecting a plurality of semiconductor devices in the back end.

* * * * *